(12) United States Patent
Katsuyama et al.

(10) Patent No.: US 9,142,351 B2
(45) Date of Patent: Sep. 22, 2015

(54) ELECTRONIC COMPONENT AND MOUNTING STRUCTURE FOR THE ELECTRONIC COMPONENT

(71) Applicant: Murata Manufacturing Co., Ltd., Nagaokakyo-shi, Kyoto-fu (JP)

(72) Inventors: Takanobu Katsuyama, Nagaokakyo (JP); Yasunari Nakamura, Nagaokakyo (JP); Naoto Muranishi, Nagaokakyo (JP); Masaaki Taniguchi, Nagaokakyo (JP); Takashi Sawada, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/549,824

(22) Filed: Nov. 21, 2014

(65) Prior Publication Data

US 2015/0221436 A1    Aug. 6, 2015

(30) Foreign Application Priority Data

Jan. 31, 2014    (JP) .................................. 2014-016446

(51) Int. Cl.
| | | |
|---|---|---|
| *H05K 1/16* | (2006.01) | |
| *H01G 2/06* | (2006.01) | |
| *H01G 4/12* | (2006.01) | |
| *H01G 4/012* | (2006.01) | |
| *H01G 4/248* | (2006.01) | |

(Continued)

(52) U.S. Cl.
CPC ............... *H01G 2/065* (2013.01); *H01G 4/012* (2013.01); *H01G 4/1209* (2013.01); *H01G 4/248* (2013.01); *H01G 4/30* (2013.01); *H05K 1/111* (2013.01); *H05K 1/181* (2013.01); *H05K 2201/10015* (2013.01)

(58) Field of Classification Search
CPC ............. H05K 1/18; H05K 5/06; H01G 4/12; H01G 4/30; H01G 4/228; H01G 4/232; H01G 4/236; H03H 7/01
USPC ............. 174/260, 50.2; 361/278, 301.4, 302, 361/303, 305, 306.3, 321.2, 525, 761, 768; 310/320, 344, 348, 366; 333/174, 185
See application file for complete search history.

(56) References Cited

U.S. PATENT DOCUMENTS 5,357,227 A *  10/1994  Tonegawa et al. ............. 333/185
5,532,656 A *   7/1996  Yoshimura .................... 333/185

(Continued)

FOREIGN PATENT DOCUMENTS

| JP | 10-335777 A | 12/1998 |
|---|---|---|
| JP | 2013-046052 A | 3/2013 |

(Continued)

OTHER PUBLICATIONS

Official Communication issued in corresponding Korean Patent Application No. 10-2014-0150248, mailed on Mar. 18, 2015.

*Primary Examiner* — Xiaoliang Chen
(74) *Attorney, Agent, or Firm* — Keating & Bennett, LLP

(57) ABSTRACT

A first terminal electrode extends from a second principal surface onto first and second side surfaces and a first end surface such as not to reach a first principal surface. A second terminal electrode extends from the second principal surface onto the first and second side surfaces and a second end surface such as not to reach the first principal surface. A third terminal electrode extends from the second principal surface onto the first and second side surfaces such as not to reach the first principal surface.

9 Claims, 7 Drawing Sheets

(51) Int. Cl.
  *H05K 1/11* (2006.01)
  *H05K 1/18* (2006.01)
  *H01G 4/30* (2006.01)

(56) References Cited

U.S. PATENT DOCUMENTS

| | | | |
|---|---|---|---|
| 6,147,573 A * | 11/2000 | Kumagai et al. | 333/185 |
| 6,373,169 B1 * | 4/2002 | Wajima | 310/320 |
| 6,456,481 B1 * | 9/2002 | Stevenson | 361/302 |
| 6,730,183 B2 * | 5/2004 | Tokuda et al. | 156/89.12 |
| 2001/0030490 A1 * | 10/2001 | Wajima et al. | 310/366 |
| 2001/0038257 A1 * | 11/2001 | Wajima | 310/320 |
| 2002/0017700 A1 * | 2/2002 | Mori et al. | 257/532 |
| 2002/0027760 A1 * | 3/2002 | Anthony | 361/127 |
| 2002/0030563 A1 * | 3/2002 | Nosaka et al. | 333/185 |
| 2002/0177360 A1 * | 11/2002 | Nakayama | 439/620 |
| 2003/0030510 A1 | 2/2003 | Sasaki et al. | |
| 2003/0141948 A1 * | 7/2003 | Maekawa et al. | 333/204 |
| 2003/0160541 A1 * | 8/2003 | Ikeda et al. | 310/313 D |
| 2003/0161122 A1 * | 8/2003 | Kotani et al. | 361/761 |
| 2003/0227738 A1 * | 12/2003 | Togashi | 361/306.1 |
| 2004/0233606 A1 * | 11/2004 | Inoue et al. | 361/118 |
| 2005/0196668 A1 * | 9/2005 | Nanno et al. | 429/162 |
| 2006/0163974 A1 * | 7/2006 | Park et al. | 310/348 |
| 2006/0285707 A1 * | 12/2006 | Izuchi et al. | 381/191 |
| 2007/0063623 A1 * | 3/2007 | Nakao et al. | 310/366 |
| 2007/0228557 A1 | 10/2007 | Onodera et al. | |
| 2008/0186652 A1 * | 8/2008 | Lee et al. | 361/306.3 |
| 2009/0207550 A1 * | 8/2009 | Feichtinger et al. | 361/301.4 |
| 2009/0257167 A1 * | 10/2009 | Kanno et al. | 361/278 |
| 2010/0025722 A1 * | 2/2010 | Wada | 257/99 |
| 2010/0109483 A1 * | 5/2010 | Nakai | 310/344 |
| 2010/0149769 A1 * | 6/2010 | Lee et al. | 361/768 |
| 2010/0165547 A1 * | 7/2010 | Kuranuki et al. | 361/525 |
| 2010/0277255 A1 * | 11/2010 | Matsushita | 333/175 |
| 2011/0205684 A1 * | 8/2011 | Yamamoto et al. | 361/305 |
| 2012/0062338 A1 * | 3/2012 | Kanno | 333/185 |
| 2012/0112855 A1 * | 5/2012 | Sato et al. | 333/174 |
| 2012/0162853 A1 * | 6/2012 | Togashi | 361/301.4 |
| 2013/0050893 A1 * | 2/2013 | Kim | 361/306.3 |
| 2013/0050897 A1 * | 2/2013 | Kim | 361/321.2 |
| 2013/0050899 A1 * | 2/2013 | Kim et al. | 361/321.2 |
| 2013/0058006 A1 | 3/2013 | Kim | |
| 2013/0214646 A1 * | 8/2013 | Kojo | 310/344 |
| 2014/0198422 A1 * | 7/2014 | Jones et al. | 361/91.1 |
| 2014/0247534 A1 * | 9/2014 | Sato et al. | 361/278 |

FOREIGN PATENT DOCUMENTS

| | | |
|---|---|---|
| KR | 10-2003-0014586 A | 2/2003 |
| KR | 10-2007-0098727 A | 10/2007 |

* cited by examiner

ELECTRONIC COMPONENT AND MOUNTING STRUCTURE FOR THE ELECTRONIC COMPONENT

BACKGROUND OF THE INVENTION

1. Field of the Invention

The present invention relates to an electronic component and a mounting structure for the electronic component.

2. Description of the Related Art

Electronic components, such as a multilayer ceramic capacitor, have hitherto been used widely. For example, Japanese Unexamined Patent Application Publication No. 2013-46052 discloses a three-terminal multilayer ceramic capacitor substantially shaped like a rectangular parallelepiped. In the three-terminal multilayer ceramic capacitor, signal terminal electrodes are provided on opposite end portions in the length direction of one principal surface, and a ground terminal electrode is provided in a center portion. For example, this three-terminal multilayer ceramic capacitor is mounted on a mounting substrate for use.

The three-terminal multilayer ceramic capacitor described in Japanese Unexamined Patent Application Publication No. 2013-46052 has problems of mountability, for example, the mounting strength is low and it is difficult to increase the mounting positional accuracy.

SUMMARY OF THE INVENTION

Accordingly, preferred embodiments of the present invention provide an electronic component having high mount ability.

An electronic component according to a preferred embodiment of the present invention includes an electronic component body; a first terminal electrode; a second terminal electrode; and a third terminal electrode; wherein the electronic component body includes first and second principal surfaces extending in a length direction and a width direction, first and second side surfaces extending in the length direction and a thickness direction, and first and second end surfaces extending in the width direction and the thickness direction; the first terminal electrode is provided on an end portion of the second principal surface on a side of the first end surface in the length direction, and extends from the second principal surface onto the first and second side surfaces and the first end surface such as not to reach the first principal surface; the second terminal electrode is provided on an end portion of the second principal surface on a side of the second end surface in the length direction, and extends from the second principal surface onto the first and second side surfaces and the second end surface such as not to reach the first principal surface; the third terminal electrode is provided on a portion of the second principal surface located between the first terminal electrode and the second terminal electrode in the length direction, and extends from the second principal surface onto the first and second side surfaces such as not to reach the first principal surface; and an area proportion of the first terminal electrode on the first end surface relative to the first end surface is higher than or equal to about 7% and lower than about 50%; an area proportion of the second terminal electrode on the second end surface relative to the second end surface is higher than or equal to about 7% and lower than about 50%; an area proportion of a total of each area of the first, second and third terminal electrodes on the first side surface relative to an entire area of the first side surface is higher than or equal to about 15% and lower than about 50%; and an area proportion of a total of each area of the first, second and third terminal electrodes on the second side surface relative to an entire area of the second side surface is higher than or equal to about 15% and lower than about 50%.

An electronic component according to another preferred embodiment of the present invention includes an electronic component body; a first terminal electrode; a second terminal electrode; a third terminal electrode; a fourth terminal electrode; a fifth terminal electrode; and a sixth terminal electrode; wherein the electronic component body includes first and second principal surfaces extending in a length direction and a width direction, first and second side surfaces extending in the length direction and a thickness direction, and first and second end surfaces extending in the width direction and the thickness direction; the first terminal electrode is provided on an end portion of the second principal surface on a side of the first end surface in the length direction, and extends from the second principal surface onto the first and second side surfaces and the first end surface such as not to reach the first principal surface; the second terminal electrode is provided on an end portion of the second principal surface on a side of the second end surface in the length direction, and extends from the second principal surface onto the first and second side surfaces and the second end surface such as not to reach the first principal surface; the third terminal electrode is provided on a portion of the second principal surface located between the first terminal electrode and the second terminal electrode in the length direction, and extends from the second principal surface onto the first and second side surfaces such as not to reach the first principal surface; the fourth terminal electrode is provided on an end portion of the first principal surface on a side of the first end surface in the length direction, and extends from the first principal surface onto the first and second side surfaces and the first end surface so as to be spaced apart from the first terminal electrode; the fifth terminal electrode is provided on an end portion of the first principal surface on a side of the second end surface in the length direction, and extends from the first principal surface onto the first and second side surfaces and the second end surface so as to be spaced apart from the second terminal electrode; the sixth terminal electrode is provided on a portion of the first principal surface located between the fourth terminal electrode and the fifth terminal electrode in the length direction, and extends from the first principal surface onto the first and second side surfaces so as to be spaced apart from the third terminal electrode; an area proportion of a total of each area of the first terminal electrode and the fourth terminal electrode on the first end surface relative to an entire area of the first end surface is higher than or equal to about 7% and lower than about 50%; an area proportion of a total of each area of the second terminal electrode and the fifth terminal electrode on the second end surface relative to an entire area of the second end surface is higher than or equal to about 7% and lower than about 50%; an area proportion of a total of each area of the first, second, third, fourth, fifth and sixth terminal electrodes on the first side surface relative to an entire area of the first side surface is higher than or equal to about 15% and lower than about 50%; and an area proportion of a total of each area of the first, second, third, fourth, fifth and sixth terminal electrodes on the second side surface relative to an entire area of the second side surface is higher than or equal to about 15% and lower than about 50%.

According to yet another preferred embodiment of the present invention, a mounting structure preferably includes an electronic component according to one of the preferred embodiments of the present invention describe above; a mounting substrate including a first land to which the first terminal electrode is electrically connected, a second land to which the second terminal electrode is electrically connected, and a third land to which the third terminal electrode is electrically connected; and a conductive material configured to join the first, second and third lands to the first, second and third terminal electrodes, respectively.

According to a further preferred embodiment of the present invention, the first land preferably extends to an outer side portion of the first terminal electrode in the length direction, and the second land extends to an outer side portion of the second terminal electrode in the length direction.

It should be noted that, as used herein, "area proportion" indicates a ratio of a total area of one terminal electrode or a total of each area of more than one terminal electrode located on one of the surfaces of the electronic component relative to the entire area of the one of the surfaces of the electronic component when viewed from a direction perpendicular to the one of the surfaces of the electronic component.

According to various preferred embodiments of the present invention, electronic components having high mountability are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
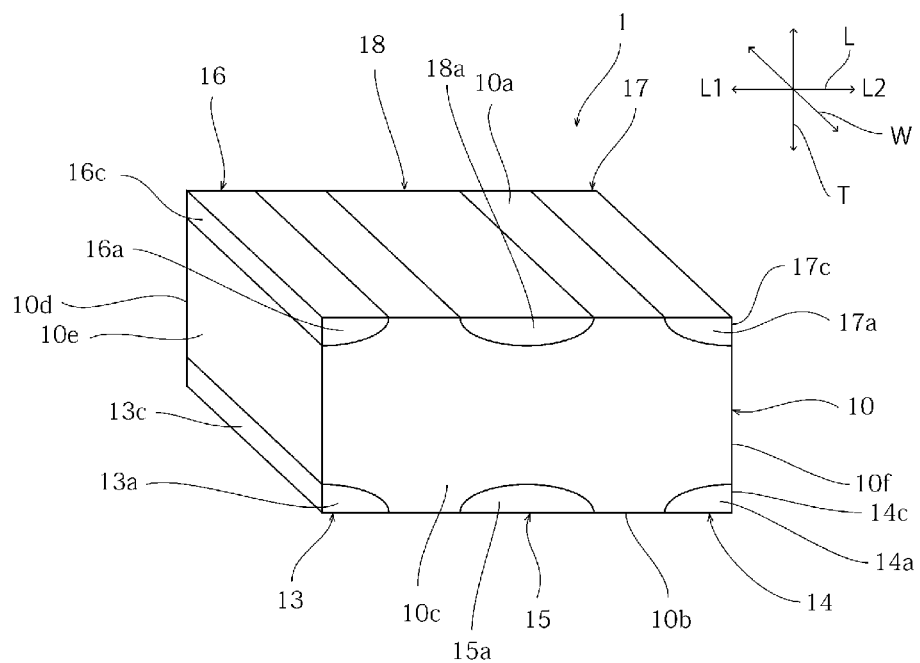
FIG. 1 is a schematic perspective view of an electronic component according to a preferred embodiment of the present invention.

Preferred embodiments of the present invention will be described below. The following preferred embodiments are just examples and the present invention is not limited by the following preferred embodiments.

In each of the drawings to be referred to in the description of the preferred embodiments of the present invention and the like, members having the same or substantially the same function will be denoted by the same reference symbols. Further, the drawings to be referred to in the description of the preferred embodiments of the present invention and the like are schematic. Hence, dimensional ratios and so on of elements depicted in the drawings are sometimes different from actual dimensional ratios and so on of the elements. The dimensional ratios and so on of the elements are also sometimes different among the drawings. Thus, specific dimensional ratios and so on of the elements should be determined in consideration of the following description.

Figure 2:
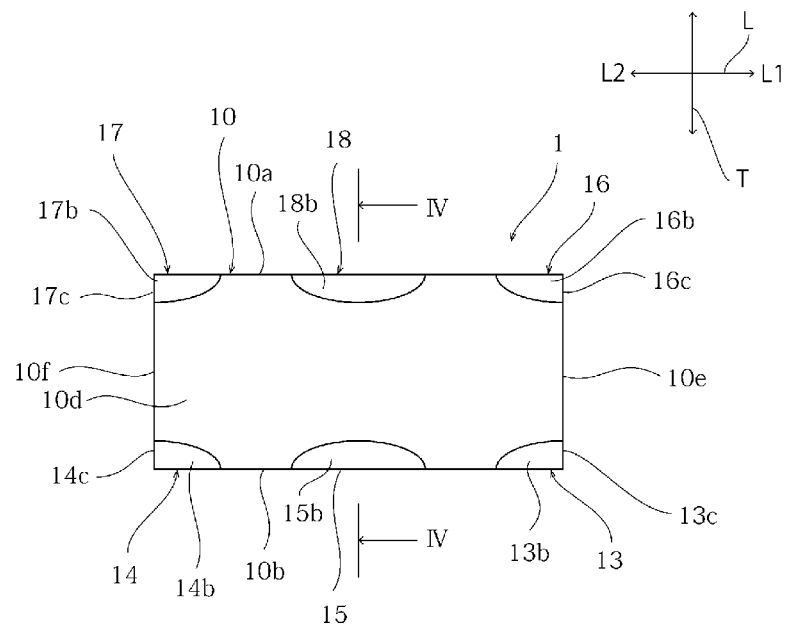
FIG. 2 is a schematic front view of a second side surface of the electronic component according to a preferred embodiment of the present invention.
Figure 3:
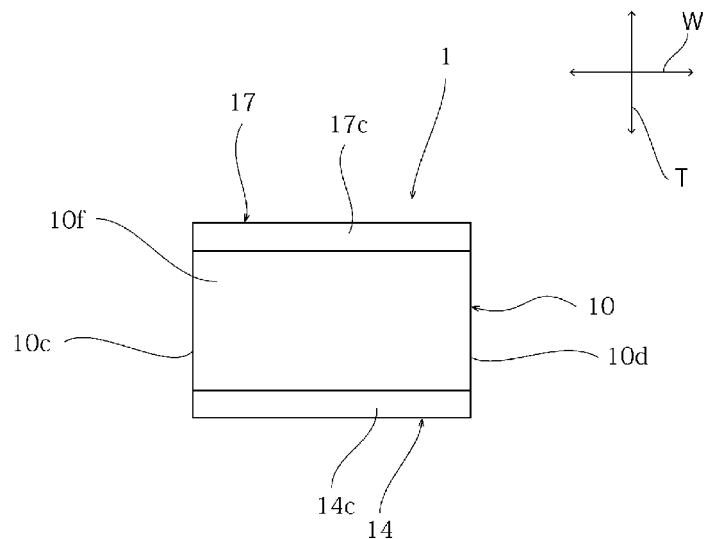
FIG. 3 is a schematic front view of a second end surface of the electronic component according to a preferred embodiment of the present invention.
Figure 4:
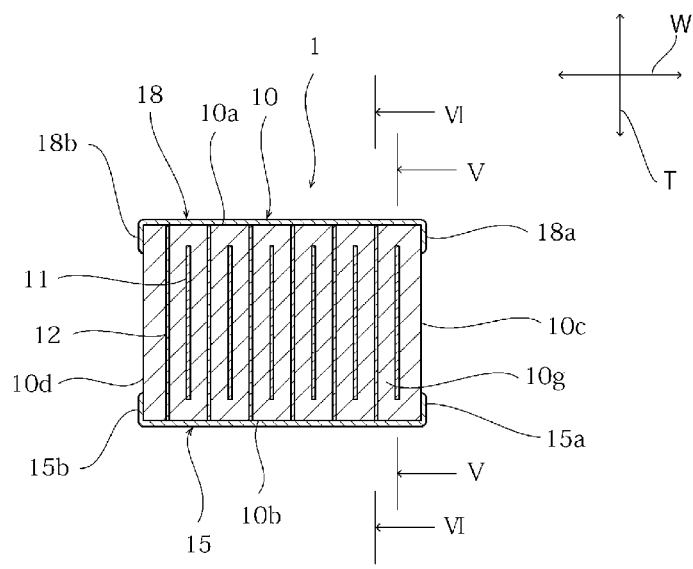
FIG. 4 is a schematic cross-sectional view, taken along line IV-IV of FIG. 2.
Figure 5:
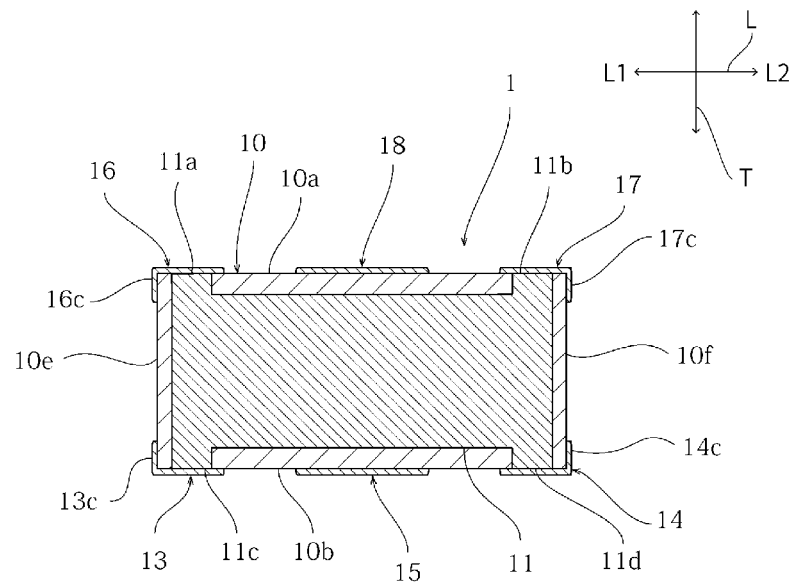
FIG. 5 is a schematic cross-sectional view, taken along line V-V of FIG. 4.
Figure 6:
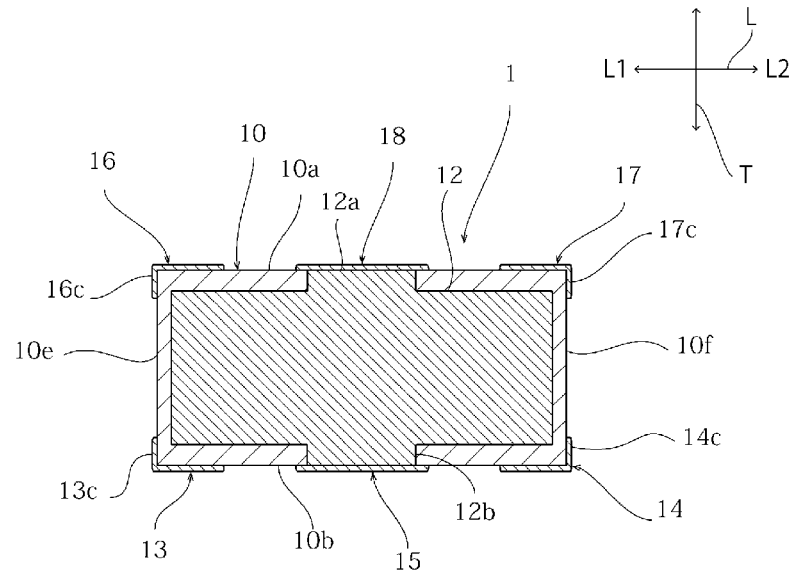
FIG. 6 is a schematic cross-sectional view, taken along line VI-VI of FIG. 4.

FIG. 1 is a schematic perspective view of an electronic component according to a preferred embodiment of the present invention. FIG. 2 is a schematic front view of a second side surface of the electronic component according to the present preferred embodiment. FIG. 3 is a schematic front view of a second end surface of the electronic component according to the present preferred embodiment. FIG. 4 is a schematic cross-sectional view, taken along line IV-IV of FIG. 2. FIG. 5 is a schematic cross-sectional view, taken along line V-V of FIG. 4. FIG. 6 is a schematic cross-sectional view, taken along line VI-VI of FIG. 4.

As illustrated in FIGS. 1 to 6, an electronic component 1 includes an electronic component body 10. The electronic component body 10 preferably has a substantially rectangular parallelepiped shape. Corner portions and ridge portions of the electronic component body 10 may be chamfered or rounded. Principal surfaces and side surfaces of the electronic component body 10 may have irregularities.

The electronic component body 10 includes first and second principal surfaces 10a and 10b, first and second side surfaces 10c and 10d, and first and second end surfaces 10e and 10f. The first and second principal surfaces 10a and 10b extend in a width direction W and a length direction L. The first and second side surfaces 10c and 10d extend in the length direction L and a thickness direction T. The first and second end surfaces 10e and 10f extend in the width direction W and the thickness direction T. The length direction L is perpendicular to the width direction W. The thickness direction T is perpendicular to the length direction L and the width direction W.

The dimensions of the electronic component body 10 are not particularly limited. For example, the electronic component body 10 preferably has a thickness of about 0.8 to 1.0 mm, a length of about 1.90 to 2.10 mm, and a width of about 1.15 to 1.35 mm.

The electronic component body 10 may be made of an appropriate ceramic material corresponding to the function of the electronic component 1. Specifically, when the electronic component 1 is a capacitor, the electronic component body 10 can be made of a dielectric ceramic material. Examples of dielectric ceramic materials are $BaTiO_3$, $CaTiO_3$, $SrTiO_3$, and $CaZrO_3$. The electronic component body 10 may be appropriately doped with accessory components, such as a Mn compound, a Mg component, a Si compound, a Fe compound, a Cr compound, a Co compound, a Ni compound, and a rare earth compound, in accordance with the required characteristics of the electronic component 1.

When the electronic component 1 is a piezoelectric component, the electronic component body 10 can be formed of a piezoelectric ceramic material. A specific example of a piezoelectric ceramic material is a PZT (lead zirconate titanate) ceramic material.

For example, when the electronic component 1 is a thermistor, the electronic component body 10 can be made of a semiconductor ceramic material. A specific example of a semiconductor ceramic material is a spinel ceramic material.

For example, when the electronic component 1 is an inductor, the electronic component body 10 can be made of a magnetic ceramic material. A specific example of a magnetic ceramic material is a ferrite ceramic material.

As illustrated in FIG. 4, a plurality of first internal electrodes 11 and a plurality of second internal electrodes 12 are provided within the electronic component body 10. The first internal electrodes 11 and the second internal electrodes 12 extend in the length direction L and the thickness direction T. The first internal electrodes 11 and the second internal electrodes 12 are alternately arranged in the width direction W at intervals. Each first internal electrode 11 and the second internal electrode 12 adjacent thereto in the width direction W are opposed to each other in the width direction W with a ceramic portion 10g being disposed therebetween.

As illustrated in FIG. 5, the first internal electrodes 11 are extended to the first and second principal surfaces 10a and 10b. Specifically, each of the first internal electrodes 11 includes first, second, third and fourth extended portions 11a to 11d. The first extended portion 11a is extended to an L1-side portion of the first principal surface 10a in the length direction L. The second extended portion 11b is extended to an L2-side portion of the first principal surface 10a in the length direction L. The third extended portion 11c is extended to an L1-side portion of the second principal surface 10b in the length direction L. The fourth extended portion 11d is extended to an L2-side portion of the second principal surface 10b in the length direction L. The first internal electrodes 11 are spaced apart from the first and second end surfaces 10e and 10f. That is, the first internal electrodes 11 are not extended to the first and second end surfaces 10e and 10f.

As illustrated in FIG. 6, the second internal electrodes 12 are extended to the first and second principal surfaces 10a and 10b. Specifically, each of the second internal electrodes 12 includes first and second extended portions 12a and 12b. The first extended portion 12a is extended to a center portion of the first principal surface 10a in the length direction L. The second extended portion 12b is extended to a center portion of the second principal surface 10b in the length direction L. The first and second extended portions 12a and 12b are not opposed to the first, second, third and fourth extended portions 11a to 11d in the width direction W. The second internal electrodes 12 are spaced apart from the first and second end surfaces 10e and 10f. That is, the second internal electrodes 12 are not extended to the first and second end surfaces 10e and 10f.

For example, the first and second internal electrodes 11 and 12 are preferably made of metal such as Ni, Cu, Ag, Pd, Au, or an Ag—Pd alloy.

As illustrated in FIGS. 1, 2, 5, and 6, first and second terminal electrodes 13 and 14 and a third terminal electrode 15 are provided on the second principal surface 10b.

As illustrated in FIG. 1, the first terminal electrode 13 is provided on a portion of the second principal surface 10b on a side of the first end surface 10e (L1 side) in the length direction L. The first terminal electrode 13 extends from one end portion to the other end portion of the second principal surface 10b in the width direction W. The first terminal electrode 13 extends from the second principal surface 10b onto the first and second side surfaces 10c and 10d and the first end surface 10e. The first terminal electrode 13 includes a portion 13a provided on the first side surface 10c, a portion 13b provided on the second side surface 10d, and a portion 13c provided on the first end surface 10e. The first terminal electrode 13 does not reach the first principal surface 10a. That is, the portions 13a to 13c do not reach the first principal surface 10a. The length of the portions 13a to 13c in the thickness direction T is preferably less than about a half of the length of the electronic component body 10 in the thickness direction, and more preferably less than or equal to about one third of the length of the electronic component body 10 in the thickness direction T, for example.

As illustrated in FIG. 5, the first terminal electrode 13 is connected to the first internal electrodes 11. The first terminal electrode 13 covers the third extended portion 11c of each of the first internal electrodes 11.

As illustrated in FIG. 1, the second terminal electrode 14 is provided on a portion of the second principal surface 10b on a side of the second end surface 10f (L2 side) in the length direction L. The second terminal electrode 14 extends from one end portion to the other end portion of the second principal surface 10b in the width direction W. The second terminal electrode 14 extends from the second principal surface 10b onto the first and second side surfaces 10c and 10d and the second end surface 10f. The second terminal electrode 14 includes a portion 14a provided on the first side surface 10c, a portion 14b provided on the second side surface 10d, and a portion 14c provided on the second end surface 10f. The second terminal electrode 14 does not reach the first principal surface 10a. That is, the portions 14a to 14c do not reach the first principal surface 10a. The length of the portions 14a to 14c in the thickness direction T is preferably less than about a half of the length of the electronic component body 10 in the thickness direction T, and more preferably less than or equal to about one third of the length of the electronic component body 10 in the thickness direction T, for example.

As illustrated in FIG. 5, the second terminal electrode 14 is connected to the first internal electrodes 11. The second terminal electrode 14 covers the fourth extended portion 11d of each of the first internal electrodes 11.

As illustrated in FIG. 1, the third terminal electrode 15 is provided on a portion of the second principal surface 10b located between the first terminal electrode 13 and the second terminal electrode 14 in the length direction L. The third terminal electrode 15 extends from one end portion to the other end portion of the second principal surface 10b in the width direction W. The third terminal electrode 15 is spaced apart from the first and second terminal electrodes 13 and 14. The third terminal electrode 15 extends from the second principal surface 10b onto the first and second side surfaces 10c and 10d. The third terminal electrode 15 includes a portion 15a provided on the first side surface 10c and a portion 15b provided on the second side surface 10d. The third terminal electrode 15 does not reach the first principal surface 10a. That is, the length of the portions 15a and 15b in the thickness direction T is preferably less than about a half of the length of the electronic component body 10 in the thickness direction T, and more preferably less than or equal to about one third of the length of the electronic component body 10 in the thickness direction T, for example.

As illustrated in FIG. 6, the third terminal electrode 15 is connected to the second internal electrodes 12. The third terminal electrode 15 covers the second extended portion 12b of each of the second internal electrodes 12.

On the first principal surface 10a, fourth and fifth terminal electrodes 16 and 17 and a sixth terminal electrode 18 are provided.

As illustrated in FIG. 1, the fourth terminal electrode 16 is provided on a portion of the first principal surface 10a on a side of the first end surface 10e (L1 side) in the length direction L. The fourth terminal electrode 16 extends from one end portion to the other end portion of the first principal surface 10a in the width direction W. The fourth terminal electrode 16 extends from the first principal surface 10a onto the first and second side surfaces 10c and 10d and the first end surface 10e. The fourth terminal electrode 16 includes a portion 16a provided on the first side surface 10c, a portion 16b provided on the second side surface 10d, and a portion 16c provided on the first end surface 10e. The fourth terminal electrode 16 does not reach the second principal surface 10b. That is, the portions 16a to 16c do not reach the second principal surface 10b. The length of the portions 16a to 16c in the thickness direction T is preferably less than about a half of the length of the electronic component body 10 in the thickness direction T, and more preferably less than or equal to about one third of the length of the electronic component body 10 in the thickness direction T, for example.

As illustrated in FIG. 5, the fourth terminal electrode 16 is connected to the first internal electrodes 11. The fourth terminal electrode 16 covers the first extended portion 11a of each of the first internal electrodes 11.

As illustrated in FIG. 1, the fifth terminal electrode 17 is provided on a portion of the first principal surface 10a on a side of the second end surface 10f (L2 side) in the length direction L. The fifth terminal electrode 17 extends from one end portion to the other end portion of the first principal surface 10a in the width direction W. The fifth terminal electrode 17 extends from the first principal surface 10a onto the first and second side surfaces 10c and 10d and the second end surface 10f. The fifth terminal electrode 17 includes a portion 17a provided on the first side surface 10c, a portion 17b provided on the second side surface 10d, and a portion 17c provided on the second end surface 10f. The fifth terminal electrode 17 does not reach the second principal surface 10b. That is, the portions 17a to 17c do not reach the first principal surface 10a. The length of the portions 17a to 17c in the thickness direction T is preferably less than about a half of the length of the electronic component body 10 in the thickness direction T, and more preferably less than or equal to about one third of the length of the electronic component body 10 in the thickness direction T, for example.

As illustrated in FIG. 5, the fifth terminal electrode 17 is connected to the first internal electrodes 11. The fifth terminal electrode 17 covers the second extended portion 11b of each of the first internal electrodes 11.

As illustrated in FIG. 1, the sixth terminal electrode 18 is provided on a portion of the first principal surface 10a located between the fourth terminal electrode 16 and the fifth terminal electrode 17 in the length direction L. The sixth terminal electrode 18 extends from one end portion to the other end portion of the first principal surface 10a in the width direction W. The sixth terminal electrode 18 is spaced apart from the fourth and fifth terminal electrodes 16 and 17. The sixth terminal electrode 18 extends from the first principal surface 10a onto the first and second side surfaces 10c and 10d. The sixth terminal electrode 18 includes a portion 18a located on the first side surface 10c, and a portion 18b located on the second side surface 10d. The sixth terminal electrode 18 does not reach the second principal surface 10b. That is, the length of the portions 18a and 18b in the thickness direction T is preferably less than about a half of the length of the electronic component body 10 in the thickness direction T, and more preferably less than or equal to about one third of the length of the electronic component body 10 in the thickness direction T, for example.

As illustrated in FIG. 6, the sixth terminal electrode 18 is connected to the second internal electrodes 12. The sixth terminal electrode 18 covers the first extended portions 12a of each of the second internal electrodes 12.

For example, the first, second, fourth, and fifth terminal electrodes 13, 14, 16, and 17 and the third and sixth terminal electrodes 15 and 18 preferably are made of an appropriate metal such as Ni, Cu, Ag, Pd, Au, Sn, Cr, or an Ag—Pd alloy.

Figure 7:
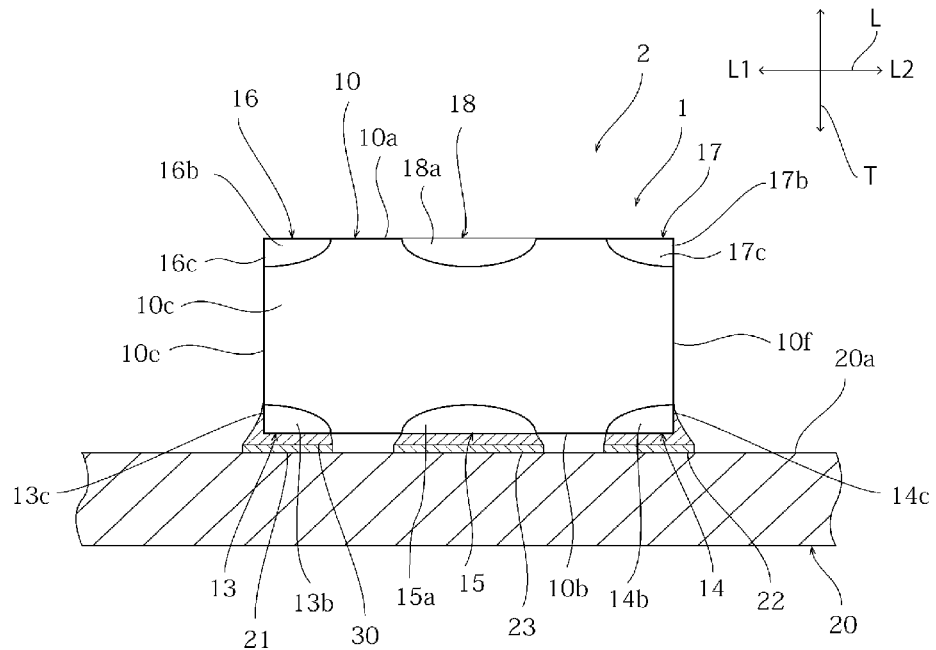
FIG. 7 is a schematic cross-sectional view of a mounting structure for an electronic component according to another preferred embodiment of the present invention.

FIG. 7 is a schematic cross-sectional view of a mounting structure for the electronic component according to the present preferred embodiment. As illustrated in FIG. 7, a mounting structure 2 for the electronic component includes the electronic component 1 and a mounting substrate 20. The electronic component 1 is mounted on a mounting surface 20a of the mounting substrate 20. The mounting substrate 20 includes first, second and third lands 21 to 23 provided on the mounting surface 20a.

The first land 21 is electrically connected to the first terminal electrode 13. The first land 21 extends to an outer side (L1 side) portion of the first terminal electrode 13 in the length direction L. That is, the first land 21 has a portion located on the outer side of the electronic component 1 in plan view (when viewed from the thickness direction T).

The second land 22 is electrically connected to the second terminal electrode 14. The second land 22 extends to an outer side (L2 side) portion of the second terminal electrode 14 in the length direction L. That is, the second land 22 has a portion located on the outer side of the electronic component 1 in plan view (when viewed from the thickness direction T).

The third land 23 is electrically connected to the third terminal electrode 15.

The lands 21 to 23 are joined to the terminal electrodes 13 to 15 by a conductive material 30, and are electrically connected thereto. The conductive material 30 is not particularly limited as long as it has conductivity. For example, the conductive material 30 can be solder.

From the viewpoint of miniaturization of the electronic component, it is preferable that the terminal electrodes should be provided only on the principal surfaces, but should not be provided on the side surfaces and the end surfaces. However, when the terminal electrodes are provided only on the principal surfaces in the electronic component, mountability of the electronic component is low. Specifically, the mounting strength (joint strength) of the electronic component with respect to the mounting substrate is low, and the mounting positional accuracy of the electronic component is likely to become low.

In the electronic component 1 of the present preferred embodiment, the first terminal electrode 13 extends over the first and second side surfaces 10c and 10d and the first end surface 10e. The second terminal electrode 14 extends over the first and second side surfaces 10c and 10d and the second end surface 10f. Further, the third terminal electrode 15 extends over the first and second side surfaces 10c and 10d. For this reason, the conductive material 30 is joined to the portions 13a, 13b, 13c, 14a, 14b, and 14c of the first terminal electrode 13 and the second terminal electrode 14 located on the side surfaces 10c and 10d and the end surfaces 10e and 10f and to the portions 15a and 15b of the third terminal electrode 15 located on the side surfaces 10c and 10d. For this reason, the joint area between the conductive material 30 and the electronic component 1 is wide. This increases the mounting strength of the electronic component 1.

From the viewpoint of increasing the mounting strength of the electronic component 1, the area proportion of the first and second terminal electrodes 13 and 14 relative to the respective first and second end surfaces 10e and 10f is more preferably higher than or equal to about 7%, for example. However, if the area proportion of the first and second terminal electrodes 13 and 14 relative to the first and second end surfaces 10e and 10f is too high, the wetting-up amount of solder during mounting increases, and this sometimes increases the mounting area. Therefore, the area proportion of the first and second terminal electrodes 13 and 14 relative to the first and second end surfaces 10e and 10f is more preferably lower than about 50%, for example. The area proportion of the first, second and third terminal electrodes relative to each of the first and second side surfaces 10c and 10d is more preferably higher than or equal to about 15%, for example. However, if the area proportion of the first, second and third terminal electrodes relative to each of the first and second side surfaces 10c and 10d is too high, the wetting-up amount of solder during mounting increases, and this sometimes increases the mounting area. Therefore, the area proportion of the first, second and third terminal electrodes relative to each of the first and second side surfaces 10c and 10d is more preferably lower than about 50%, for example.

The area proportion of the first and second terminal electrodes 13 and 14 relative to the first and second end surfaces 10e and 10f can be determined by irradiating the first end surface 10e and the second end surface 10f with light from a white LED lamp, adjusting the light amount so that a difference in luminance is formed between the electronic component body and the first and second terminal electrodes, and binarizing the luminances of the electronic component body and the first and second terminal electrodes.

The area proportion of the first, second and third terminal electrodes relative to each of the first and second side surfaces 10c and 10d can be determined by irradiating the first side surface 10c and the second side surface 10d with light from the white LED lamp, adjusting the light amount so that a difference in luminance is formed between the electronic component body and the first, second and third terminal electrodes, and binarizing the luminances of the electronic component and the first, second and third terminal electrodes.

From the viewpoint of increasing the mounting strength of the electronic component 1, the area proportion of the first, second, fourth, and fifth terminal electrodes 13, 14, 16, and 17 relative to each of the first and second end surfaces 10e and 10f is more preferably higher than or equal to about 7%, for example. However, if the area proportion of the first, second, fourth, and fifth terminal electrodes 13, 14, 16, and 17 relative to each of the first and second end surfaces 10e and 10f is too high, the wetting-up amount of solder during mounting increases, and this sometimes increases the mounting area. Therefore, the area proportion of the first, second, fourth, and fifth terminal electrodes 13, 14, 16, and 17 relative to each of the first and second end surfaces 10e and 10f is more preferably lower than about 50%, for example. The area proportion of the first, second, third, fourth, fifth and sixth terminal electrodes relative to each of the first and second side surfaces 10c and 10d is more preferably higher than or equal to about 15%, for example. However, if the area proportion of the first, second, third, fourth, fifth and sixth terminal electrodes relative to each of the first and second side surfaces 10c and 10d is too high, the wetting-up amount of solder during mounting increases, and this sometimes increases the mounting area. Therefore, the area proportion of the first, second, third, fourth, fifth and sixth terminal electrodes relative to each of the first and second side surfaces 10c and 10d is more preferably lower than about 50%, for example.

The area proportion of the first, second, fourth, and fifth terminal electrodes 13, 14, 16, and 17 relative to each of the first and second end surfaces 10e and 10f can be determined by irradiating the first end surface 10e and the second end surface 10f with light from the white LED lamp, adjusting the light amount so that a difference in luminance is formed between the electronic component body and the first, second, fourth, and fifth terminal electrodes, and binarizing the luminances of the electronic component body and the first, second, fourth, and fifth electrodes.

The area proportion of the first, second, third, fourth, fifth and sixth terminal electrodes relative to each of the first and second side surfaces 10c and 10d can be determined by irradiating the first side surface 10c and the second side surface 10d with light from the white LED lamp, adjusting the light amount so that a difference in luminance is formed between the electronic component body and the first to sixth terminal electrodes, and binarizing the luminances of the electronic component body and the first to sixth terminal electrodes.

From the viewpoint of increasing the mounting strength of the electronic component 1, it is conceivable to form the first and second terminal electrodes and the third terminal electrode such that they reach the first principal surface. In this case, however, the portions of the terminal electrodes located on the side surfaces and the end surfaces are likely to become thick, and this sometimes increases the size of the electronic component. Further, the portions of the conductive material located on the side surfaces and the end surfaces become thick, and this sometimes increases the required mounting area of the electronic component.

In normal cases, the area of the side surfaces is smaller than that of the principal surfaces. Hence, the opposed area of internal electrodes is likely to be smaller in a multilayer ceramic capacitor including internal electrodes parallel to side surfaces than in a multilayer ceramic capacitor including internal electrodes parallel to principal surfaces. For this reason, in the electronic component 1 of the present preferred embodiment in which the first and second internal electrodes 11 and 12 are provided in the length direction L and the thickness direction T, it is an important issue to reduce the size and mounting area.

In the electronic component 1 of the present preferred embodiment, the first and second terminal electrodes 13 and 14 and the third terminal electrode 15 are preferably arranged such as not to reach the first principal surface 10a. For this reason, the electronic component 1 is miniaturized. Also, the mounting area required to mount the electronic component 1 is significantly reduced. That is, the electronic component 1 is easily mounted because of its small size, small mounting area, and high mounting strength.

For example, when the conductive material 30 is formed of solder, during mounting, the electronic component 1 is moved in the length direction L and the width direction W by surface tension of solder in a melted state so that the total surface area of the melted solder is minimized. Particularly when the first land 21 is located on the outer side portion of the first terminal electrode 13 in the length direction L and the second land 22 is located on the outer side portion of the second terminal electrode 14 in the length direction L, the electronic component 1 is likely to move. For this reason, the mounting position of the electronic component 1 is stabilized. That is, the electronic component 1 is easily mounted with high positioning accuracy. The electronic component 1 is capable of being mounted at high density because the mounting position is rarely displaced.

When the fourth and fifth terminal electrodes 16 and and the sixth terminal electrode 18 are preferably symmetrical or substantially symmetrical to the first and second terminal electrodes 13 and 14 and the third terminal electrode 15, it is not always necessary to identify the orientation of the electronic component 1 in the thickness direction T. Therefore, the electronic component 1 can be mounted easily.

Figure 12:
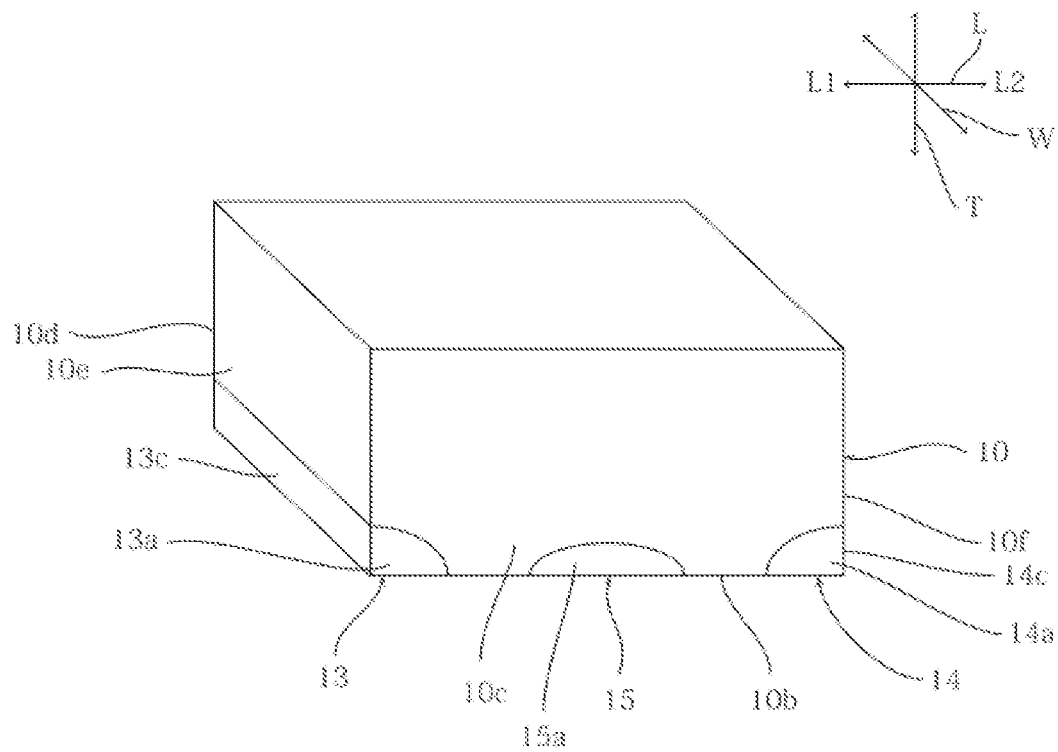
FIG. 12 is a schematic perspective view of an electronic component according to a modification of a preferred embodiment of the present invention.
Figure 13:
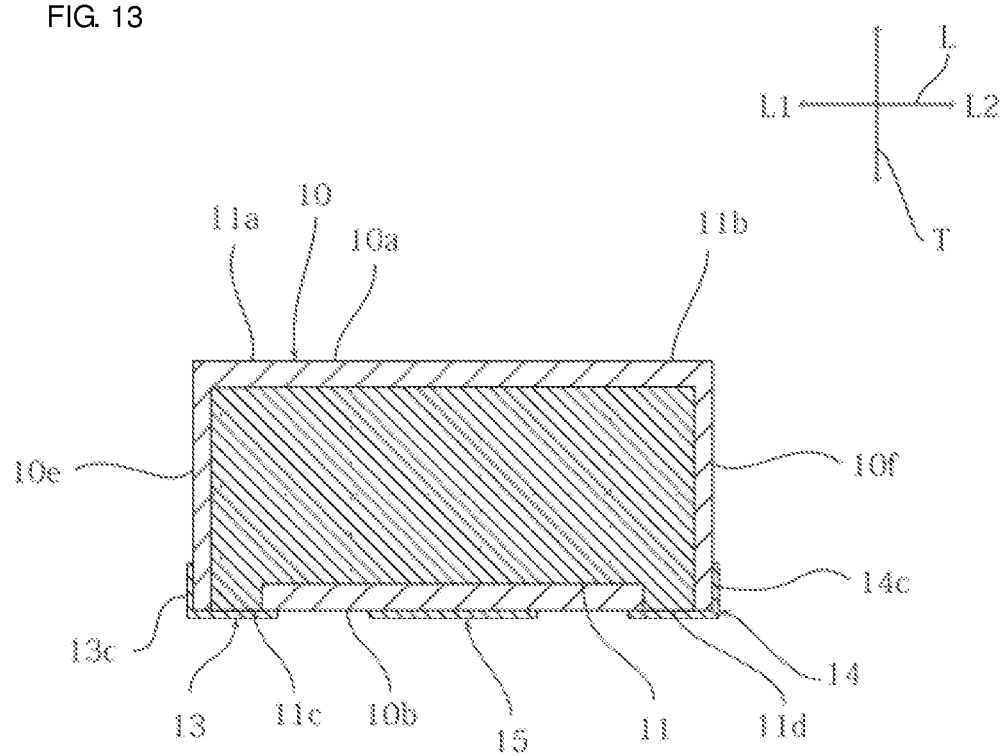
FIG. 13 is a schematic cross-sectional view of the electronic component according to the modification of a preferred embodiment of the present invention.
Figure 14:
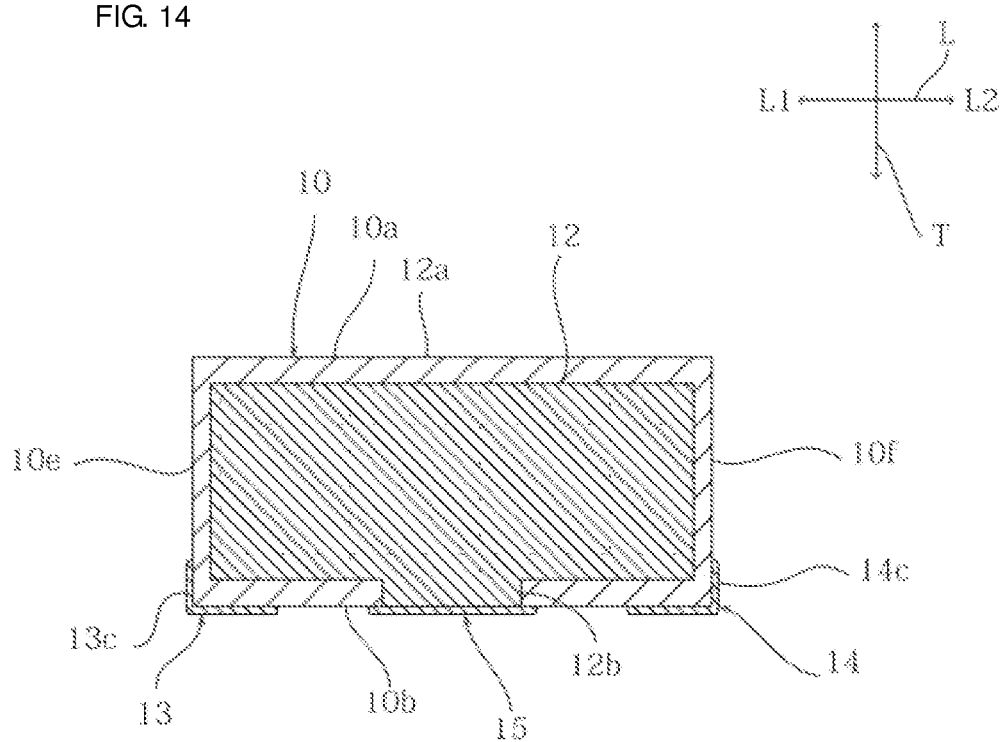
FIG. 14 is a schematic cross-sectional view of the electronic component according to the modification of a preferred embodiment of the present invention.

Without forming the fourth and fifth terminal electrodes 16 and 17 and the sixth terminal electrode 18, only the first and second terminal electrodes 13 and 14 and the third terminal electrode 15 may be provided, as illustrated in FIGS. 12, 13, and 14.

First Experimental Example

In a first experimental example, an electronic component was produced which had a structure substantially similar to the structure of the above-described electronic component 1 except that first, second, fourth, and fifth terminal electrodes extended from a first or second principal surface and reached first and second side surfaces, but did not reach first and second end surfaces. This electronic component was mounted on a mounting substrate in a manner substantially similar to the manner illustrated in FIG. 7. Solder was used for mounting. The dimension of the solder in the thickness direction was about 0.2 to about ⅔ times as large as the dimension of the electronic component in the thickness direction.

First Evaluation

Figure 8:
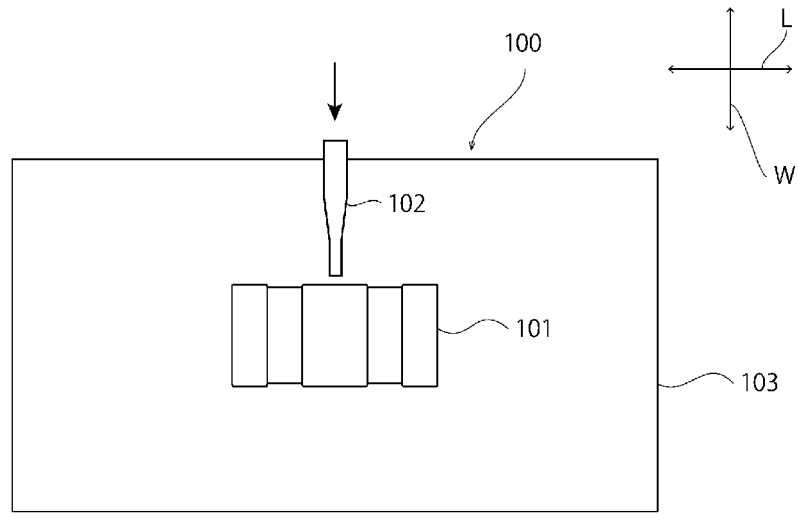
FIG. 8 is a schematic plan view explaining a first evaluation in a first experimental example.

As illustrated in FIG. 8, in a state in which a mounting substrate 103 of a mounting structure 100 for an electronic component 101 produced in the first experimental example was fixed, a center portion of the electronic component 101 in the length direction L was pressed in the width direction W at a weighting velocity of about 0.5 mm/sec with a member 102 extending in the thickness direction T, and the stress applied to the member 102 when the electronic component 101 fell off was measured as mounting strength. The measurement result is shown in FIG. 9.

Figure 9:
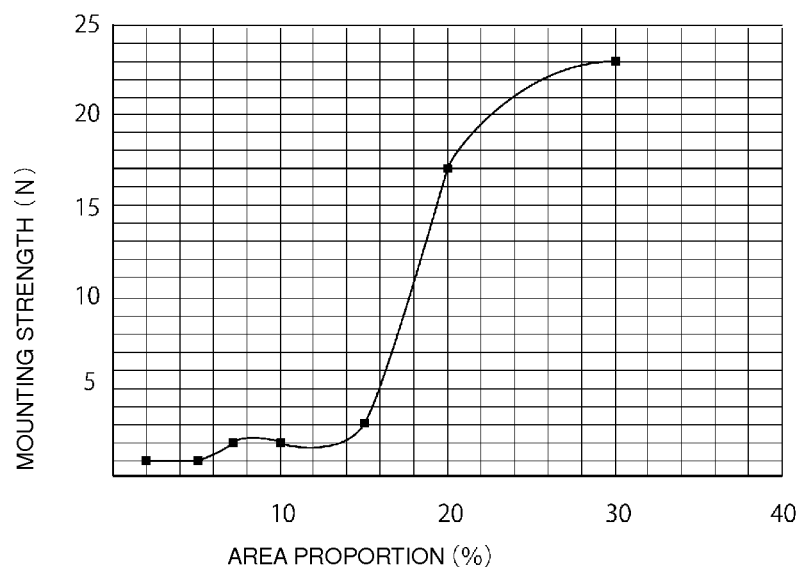
FIG. 9 is a graph showing the result of the first evaluation.

In FIG. 9, the horizontal axis shows the area proportion of the third and sixth terminal electrodes and the first, second, fourth, and fifth terminal electrodes relative to each of the first and second side surfaces.

From the result shown in FIG. 9, it is understood that the mounting strength of the electronic component is greatly increased by setting the area proportion of the third and sixth terminal electrodes and the first, second, fourth, and fifth terminal electrodes relative to each of the first and second side surfaces to be higher than or equal to about 7%, for example. Further, it is understood, from the viewpoint of further increasing the mounting strength of the electronic component, that the area proportion of the third and sixth terminal electrodes and the first, second, fourth, and fifth terminal electrodes relative to each of the first and second side surfaces is more preferably set to be higher than or equal to about 10%, for example.

Second Experimental Example

In a second experimental example, an electronic component was produced which had a structure substantially similar to the structure of the above-described electronic component 1 except that first, second, fourth, and fifth terminal electrodes extended from a first or second principal surface to first and second end surfaces, but did not reach first and second side surfaces, and that third and sixth terminal electrodes were provided only on the first or second principal surface. This electronic component was mounted on a mounting substrate in a manner substantially similar to the manner illustrated in FIG. 7. Solder was used for mounting. The dimension of the solder in the thickness direction was about 0.2 to about ⅔ times as large as the dimension of the electronic component in the thickness direction.

Second Evaluation

Figure 10:
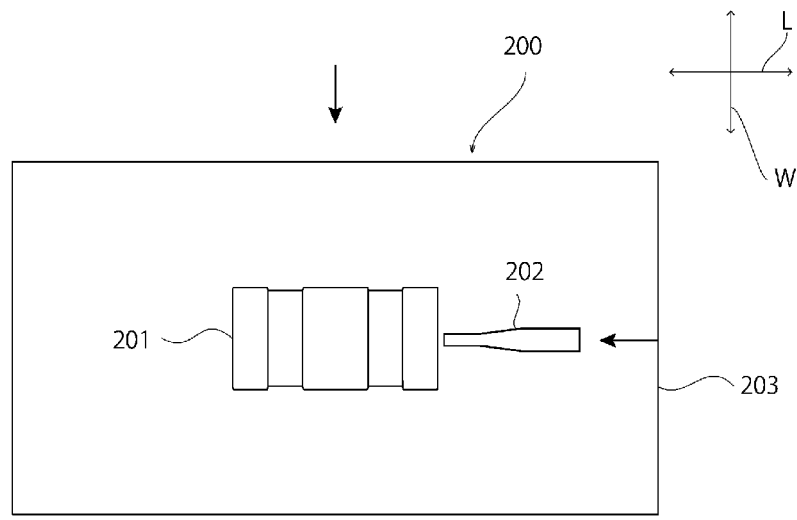
FIG. 10 is a schematic plan view explaining a second evaluation in a second experimental example.

As illustrated in FIG. 10, in a state in which a mounting substrate 203 of a mounting structure 200 for an electronic component 201 produced in the second experimental example was fixed, a center portion of the electronic component 201 in the width direction W was pressed in the length direction L at a weighting velocity of about 0.5 mm/sec with a member 202 extending in the thickness direction T, and the stress applied to the member 202 when the electronic component 201 fell off was measured as mounting strength. The measurement result is shown in FIG. 11.

Figure 11:
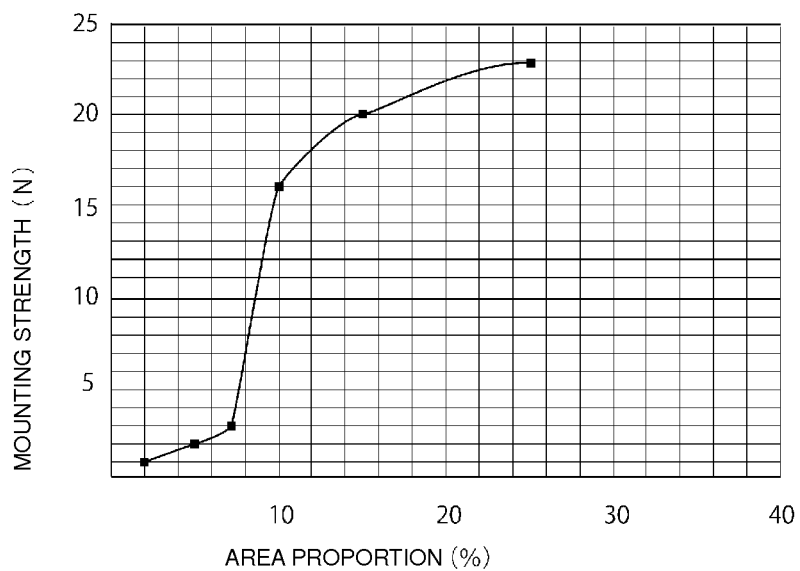
FIG. 11 is a graph showing the result of the second evaluation.

In FIG. 11, the horizontal axis shows the area proportion of the first, second, fourth, and fifth terminal electrodes relative to each of the first and second end surfaces.

From the result shown in FIG. 11, it is understood that the mounting strength of the electronic component is significantly increased by setting the area proportion of the first, second, fourth, and fifth terminal electrodes relative to each of the first and second end surfaces to be higher than or equal to about 15%. Further, it is understood, from the viewpoint of further increasing the mounting strength of the electronic component, that the area proportion of the first, second, fourth, and fifth terminal electrodes relative to each of the first and second end surfaces is more preferably set to be higher than or equal to about 20%, for example.

FIG. 12 is a schematic perspective view of a multilayer capacitor 1 according to a modification of a preferred embodiment of the present invention. FIG. 13 is a schematic cross-sectional view of the electronic component according to the modification of a preferred embodiment of the present invention. FIG. 14 is a schematic cross-sectional view of the electronic component according to the modification of a preferred embodiment of the present invention.

As illustrated in FIGS. 13 and 14, a plurality of first internal electrodes 11 and a plurality of second internal electrodes 12 are provided within the electronic component body 10.

As illustrated in FIG. 13, each first inner electrode 11 extends to the second principal surfaces 10*b*, respectively. Specifically, each first inner electrode 11 includes first and second extending portions 11*c* and 11*d* which are exposed at predetermined portions of the second principal surface 10*b*. In other words, the first extending portion 11*c* extends to a portion of the second principal surface 10*b* on an L1 side in the length direction L. The first extending portion 11*c* extends to a portion of the second principal surface 10*b* on an L2 side in the length direction L. Each first inner electrode 11 is spaced away from the first end surface 10*e*, the second end surface 10*f*, and the first principal surface 10*a*. That is, each first inner electrode 11 does not extend to the first end surface 10*e*, second end surface 10*f*, and the first principal surface 10*a*. In other words, each first inner electrode 11 does not have any portions which are exposed at the first end surface 10*e*, the second end surface 10*f*, and the first principal surface 10*a*.

As illustrated in FIG. 14, each second inner electrode 12 extends to the second principal surface 10*b*, respectively. Specifically, each second inner electrode 12 includes first extending portions 12*b* exposed at a predetermined portion of the second principal surface 10*b*. In other words, the first extending portion 12*b* extends to a center portion of the second principal surface 10*b* in the length direction L. The first extending portions 12*b* and the first and second extending portions 11*c* and 11*d* are arranged so as not to face each other in the width direction W. Each second inner electrode 12 is spaced away from the first end surface 10*e*, the second end surface 10*f*, and the first principal surface 10*a*. That is, each second inner electrode 12 does not extend to the first end surface 10a, the second end surface 10f, and the first principal surface 10a. In other words, each first inner electrode 12 does not have any portions which are exposed at the first end surface 10e, the second end surface 10f, and the first principal surface 10a.

As illustrated in FIGS. 12, 13, and 14, terminal electrodes 13 to 15 are provided on a portion of the second principal surface 10b. According to the present preferred embodiment, the terminal electrodes 13 and 14 preferably respectively configure ground terminal electrodes (negative terminal electrode). The terminal electrode 15 preferably configures a signal terminal electrode (positive terminal electrode). The terminal electrodes 13 to 15 are not provided on the first principal surface 10a.

As illustrated in FIG. 12, the terminal electrode 13 is provided on a portion of the second principal surface 10b on a side of the first end surface 10e (L1 side) in the length direction L. The terminal electrode 13 extends from one end portion to the other end portion of the second principal surface 10b in the width direction W. The terminal electrode 13 extends from the second principal surface 10b onto the first and second side surfaces 10c and 10d and the first end surface 10e. The terminal electrode 13 includes a portion 13a provided on the first side surface 10c, a portion 13b provided on the second side surface 10d, and a portion 13c provided on the first end surface 10e. The terminal electrode 13 does not reach the first principal surface 10a. That is, the portions 13a, 13b, 13c do not reach the first principal surface 10a. As illustrated in FIG. 13, the terminal electrode 13 is connected to the first inner electrodes 11. The terminal electrode 13 covers the first extending portion 11c of each first inner electrode 11.

As illustrated in FIG. 12, the terminal electrode 14 is provided on a portion of the second principal surface 10b on a side of the second end surface 10f (L2 side) in the length direction L. The terminal electrodes 14 extends from one end portion to the other end portion of the second principal surface 10b in the width direction W. The terminal electrode 14 extends from the second principal surface 10b onto the first and second side surfaces 10c and 10d and the second end surface 10f. The terminal electrode 14 includes a portion 14a provided on the first side surface 10c, a portion 14b provided on the second side surface 10d, and a portion 14c provided on the second end surface 10f. The terminal electrode 14 does not reach the first principal surface 10a. That is, the portions 14a, 14b, 14c do not reach the first principal surface 10a. As illustrated in FIG. 13, the terminal electrode 14 is connected to the first inner electrodes 11. The terminal electrode 14 covers the second extending portion 11d of each first inner electrode 11.

As illustrated in FIG. 12, the terminal electrode 15 is provided on a portion of the second principal surface 10b between the terminal electrode 13 and the terminal electrode 14 in the length direction L. The terminal electrode 15 extends from one end portion to the other end portion of the second principal surface 10b in the width direction W. The terminal electrode 15 extends from the second principal surface 10b onto the first and second side surfaces 10c and 10d. The terminal electrode 15 is spaced away from the terminal electrodes 13 and 14. The terminal electrode 15 includes a portion 15a positioned on the first side surface 10c and a portion 15b positioned on the second side surface 10d. The terminal electrode 15 does not reach the first principal surface 10a. As illustrated in FIG. 14, the terminal electrode 15 is connected to the second inner electrodes 12. The terminal electrode 15 covers the first extending portion 12b of each second inner electrode 12.

From the viewpoint of increasing the mounting strength of the electronic component 1, an area proportion of the first terminal electrode 13 on the first end surface 10e relative to the first end surface 10e is more preferably higher than or equal to about 7%, for example. However, from the viewpoint of reducing the mounting area of the electronic component 1, the area proportion of the first terminal electrode 13 on the first end surface 10e relative to the first end surface 10e is more preferably lower than about 50%, for example.

From the viewpoint of increasing the mounting strength of the electronic component 1, an area proportion of the second terminal electrode 14 on the second end surface 10f relative to the second end surface 10f is more preferably higher than or equal to about 7%, for example. However, from the viewpoint of reducing the mounting area of the electronic component 1, the area proportion of the second terminal electrode 14 on the second end surface 10f relative to the second end surface 10f is more preferably lower than about 50%, for example.

From the viewpoint of increasing the mounting strength of the electronic component 1, each of an area proportion of the first, second and third terminal electrodes 13, 14 and 15 on the first side surface 10c relative to the first side surface 10c and an area proportion of the first, second and third terminal electrodes 13, 14 and 15 on the second side surface 10d relative to the second side surface 10d is more preferably higher than or equal to about 15%, for example. However, from the viewpoint of reducing the mounting area of the electronic component 1, each of the area proportion of the first, second and third terminal electrodes 13, 14 and 15 on the first side surface 10c relative to the first side surface 10c and an area proportion of the first, second and third terminal electrodes 13, 14 and 15 on the second side surface 10d relative to the second side surface 10d is more preferably lower than about 50%, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   an electronic component body;
   a first terminal electrode;
   a second terminal electrode; and
   a third terminal electrode; wherein
   the electronic component body includes first and second principal surfaces extending in a length direction and a width direction, first and second side surfaces extending in the length direction and a thickness direction, and first and second end surfaces extending in the width direction and the thickness direction;
   the first terminal electrode is provided on an end portion of the second principal surface on a side of the first end surface in the length direction, and extends from the second principal surface onto the first and second side surfaces and the first end surface such as not to reach the first principal surface;
   the second terminal electrode is provided on an end portion of the second principal surface on a side of the second end surface in the length direction, and extends from the second principal surface onto the first and second side surfaces and the second end surface such as not to reach the first principal surface;
   the third terminal electrode is provided on a portion of the second principal surface located between the first terminal electrode and the second terminal electrode in the length direction, and extends from the second principal surface onto the first and second side surfaces such as not to reach the first principal surface; and an area proportion of the first terminal electrode on the first end surface relative to the first end surface is higher than or equal to about 7% and lower than about 50%;

an area proportion of the second terminal electrode on the second end surface relative to the second end surface is higher than or equal to about 7% and lower than about 50%;

an area proportion of a total of each area of the first, second and third terminal electrodes on the first side surface relative to an entire area of the first side surface is higher than or equal to about 15% and lower than about 50%;

the electronic component includes a plurality of first inner electrodes which are exposed at the second principal surface and connected to the first and second terminal electrodes at the second principal surface; and the plurality of first inner electrodes are spaced apart from both of the first and second end surfaces and are not connected to portions of the first and second terminal electrodes at the first and second end surfaces.

2. A mounting structure for an electronic component, comprising:

the electronic component according to claim 1;

a mounting substrate including a first land to which the first terminal electrode is electrically connected, a second land to which the second terminal electrode is electrically connected, and a third land to which the third terminal electrode is electrically connected; and a conductive material configured to join the first, second and third lands to the first, second and third terminal electrodes, respectively.

3. The mounting structure for the electronic component according to claim 2, wherein the first land extends to an outer side portion of the first terminal electrode in the length direction, and the second land extends to an outer side portion of the second terminal electrode in the length direction.

4. The electronic component according to claim 1, wherein an area proportion of a total of each area of the first, second and third terminal electrodes on the first side surface relative to an entire area of the first side surface is higher than or equal to about 15% and lower than about 50%; and an area proportion of a total of each area of the first, second and third terminal electrodes on the second side surface relative to an entire area of the second side surface is higher than or equal to about 15% and lower than about 50%.

5. The electronic component according to claim 1, wherein a dimension in the thickness direction of the electronic component body is less than a dimension in the width direction of the electronic component.

6. The electronic component according to claim 1, wherein the electronic component body has a dimension in the thickness direction of about 0.8 mm to about 1.0 mm, a dimension in the length of about 1.90 mm to about 2.10 mm, and a dimension in the width direction of about 1.15 mm to about 1.35 mm.

7. The electronic component according to claim 1, wherein the first and second terminal electrodes are ground terminal electrodes; and the third terminal electrode is a signal terminal electrode.

8. The electronic component according to claim 1, wherein the first and second internal electrodes are spaced apart from the first principal surface.

9. The electronic component according to claim 8, wherein none of the first, second, and third terminal electrodes or any other terminal electrodes are provided on the first principal surface.

* * * * *